(12) United States Patent
Nakaki

(10) Patent No.: US 7,825,379 B2
(45) Date of Patent: Nov. 2, 2010

(54) THERMAL-TYPE INFRARED IMAGE SENSING DEVICE AND METHOD OF PRODUCING THE SAME

(75) Inventor: Yoshiyuki Nakaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 102 days.

(21) Appl. No.: 12/258,764

(22) Filed: Oct. 27, 2008

(65) Prior Publication Data

US 2009/0146059 A1    Jun. 11, 2009

(30) Foreign Application Priority Data

Nov. 9, 2007   (JP) ............................. 2007-291875
Sep. 16, 2008  (JP) ............................. 2008-236397

(51) Int. Cl.
*H01L 25/00* (2006.01)
(52) U.S. Cl. .................................................... 250/332
(58) Field of Classification Search .................. 250/332
See application file for complete search history.

(56) References Cited

U.S. PATENT DOCUMENTS

| 6,201,243 | B1 * | 3/2001 | Jerominek | ............... | 250/338.1 |
| 6,552,344 | B1 | 4/2003 | Sone et al. | | |
| 6,576,556 | B2 | 6/2003 | Kimata et al. | | |
| 7,145,144 | B2 | 12/2006 | Nakaki et al. | | |
| 2005/0029454 | A1 * | 2/2005 | Iida et al. | ..................... | 250/332 |
| 2008/0087823 | A1 * | 4/2008 | Murata et al. | ............... | 250/332 |

FOREIGN PATENT DOCUMENTS

| JP | 2000-97767 | 4/2000 |
| JP | 2001-215152 | 8/2001 |
| JP | 2005-214639 | 8/2005 |
| JP | 2006-220555 | 8/2006 |

* cited by examiner

*Primary Examiner*—David P Porta
*Assistant Examiner*—Kiho Kim
(74) *Attorney, Agent, or Firm*—Oblon, Spivak, McClelland, Maier & Neustadt, L.L.P.

(57) ABSTRACT

A thermal-type infrared image sensing device and method of producing a thermal-type infrared image sensing device are provided. The thermal-type infrared image sensing device includes pixel elements that are two-dimensionally arranged on a semiconductor substrate. Each pixel element includes a detector that detects temperature, an infrared-light absorber that absorbs incident infrared light and that converts the light into heat, and a support that supports the detector apart from the semiconductor substrate. The thermal-type infrared image sensing device also includes reference-pixel elements that are arranged adjacent to and along a row of the pixel elements. Each of the reference pixels generates a reference signal, and each of the reference pixels includes a structure that shields a detector from incident infrared light. The detectors of the pixel elements and the reference-pixel elements are each connected to the semiconductor substrate through the respective supports.

11 Claims, 8 Drawing Sheets

THERMAL-TYPE INFRARED IMAGE SENSING DEVICE AND METHOD OF PRODUCING THE SAME

BACKGROUND OF THE INVENTION

1. Field of the Invention

The present invention relates to thermal-type infrared image sensing devices having their sensitivity in the far-infrared region.

2. Description of the Related Art

In a conventional infrared image sensing device, because, if the device temperature drifts, due to its output-signal level going outside the dynamic range, image sensing cannot be performed, the device needs to be kept at a constant temperature using a temperature-control mechanism. Therefore, in order to omit the temperature-control mechanism, reference-pixel elements each having no heat-insulated structure are formed other than pixel elements each having a heat-insulated structure; thus, by feeding back signals from the reference-pixel elements into a control circuit for driving the pixel elements, even if the device temperature is not controlled, the output level of the device has been made to be within a certain range, for example, as disclosed in page 12, and FIG. 1 of Japanese Patent Application Publication Laid-Open No. 2005-214639 (Patent Document 1).

A device, for example, has also been disclosed in page 3, and FIG. 6 of Japanese Patent Application Publication Laid-Open No. 2000-97767 (Patent Document 2), in which a light-shielding plate is provided on its package for shielding it from incident infrared light, and the light-shielded portion is used as reference-pixel elements.

In a general infrared image sensing device, in order to detect status change of the detector due to incident infrared light, voltage is applied to its pixel elements. For example, in the infrared image sensing device disclosed in Patent Document 1, voltage has been applied to each pixel element through its driving line. Therefore, caused by imaging-signal reading-out operations of the infrared image sensing device, self-heat generation has occurred in the pixel elements. The heat amount of the self-heat generation has been far much higher than a temperature rise due to infrared light incident from the exterior of the device.

In such an infrared image sensing device as disclosed in Patent Document 1, each reference-pixel element has been configured without a heat-insulated structure. Therefore, even when image sensing is performed without infrared light being incident from the exterior of the device, difference between output levels read out from the pixel element and the reference-pixel element occurs; accordingly, a signal outputted from the reference-pixel element has not been able to be used as a reference voltage for pixel signals.

The reason is as follows. The device has been configured in such a way that, for example, when the reference-pixel element has no heat-insulated structure, because the amount of heat transport (thermal conductance) from the detector of the pixel element to the image sensing device main body is significantly large, the reference-pixel element is easy to be cooled. Therefore, caused by the self-heat generation accompanying the operation of reading out the pixel signal, difference between the signal levels outputted from the reference-pixel element and the pixel element has occurred. Accordingly, a disadvantage has occurred in that a signal processing operation assuming this output difference must be considered.

The device can also be configured in such a way that, instead of the reference-pixel element having no heat-insulated structure as described above, the reference-pixel element does not absorb infrared light incident from the exterior, for example, that the infrared-light absorber is omitted. However, in such configuration, because infrared light is incident on the detector of the reference-pixel element, and an output signal is generated, a disadvantage has occurred in that the resultant voltage cannot be used as the reference voltage.

In the meantime, in the method disclosed in Patent Document 2 in which the reference-pixel-element portion is formed by providing the light-shielding plate on the package, the pixel element and the reference-pixel element can be formed to be exactly the same structure. However, because incident light is subject to diffraction due to the light-shielding plate, in order to prevent the effect, by isolating the pixel-element portion from the reference-pixel-element portion completely shielded from light, the portion on which light is incident and the portion completely shielded from the light need to be separated. Therefore, it has been disadvantageous to miniaturize the image sensing device.

SUMMARY OF THE INVENTION

An objective of the present invention, which is made to solve the above described problem, is to provide an infrared image sensing device having a pixel structure in which an output level as a reference voltage of a reference-pixel element comes close to that of a pixel element.

A thermal-type infrared image sensing device according to the present invention including pixel elements, being two-dimensionally arranged on a semiconductor substrate, each having a first detector for detecting temperature, an infrared-light absorber, supported above the first detector apart therefrom through a connector thereon, for absorbing incident infrared light and converting the light into heat, and a first support for supporting the first detector apart from the semiconductor substrate, includes reference-pixel elements, arranged adjacent to and along a row of the pixel elements two-dimensionally arranged, each for generating a reference signal to be a reference for a signal generated by each of the pixel elements, each having a second detector identical to the first detector, a second support identical to the first support for supporting the second detector apart from the semiconductor substrate, and a light reflector for shielding the second detector from incident infrared light, and the light reflector being a part of a layer deposited on the surface of the semiconductor substrate, and being supported above the second detector apart therefrom.

DETAILED DESCRIPTION OF THE PREFERRED EMBODIMENTS

Embodiment 1

Figure 1:
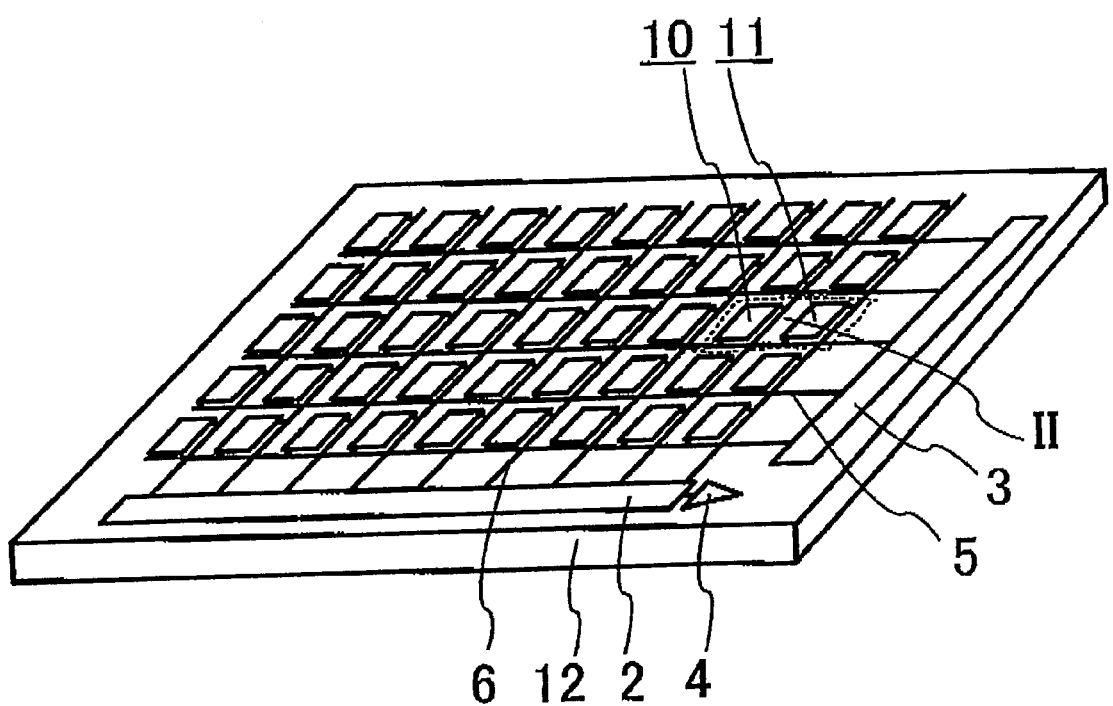
FIG. 1 is a perspective view illustrating a configuration of a thermal-type infrared image sensing device according to Embodiment 1 of the present invention.
Figure 2:
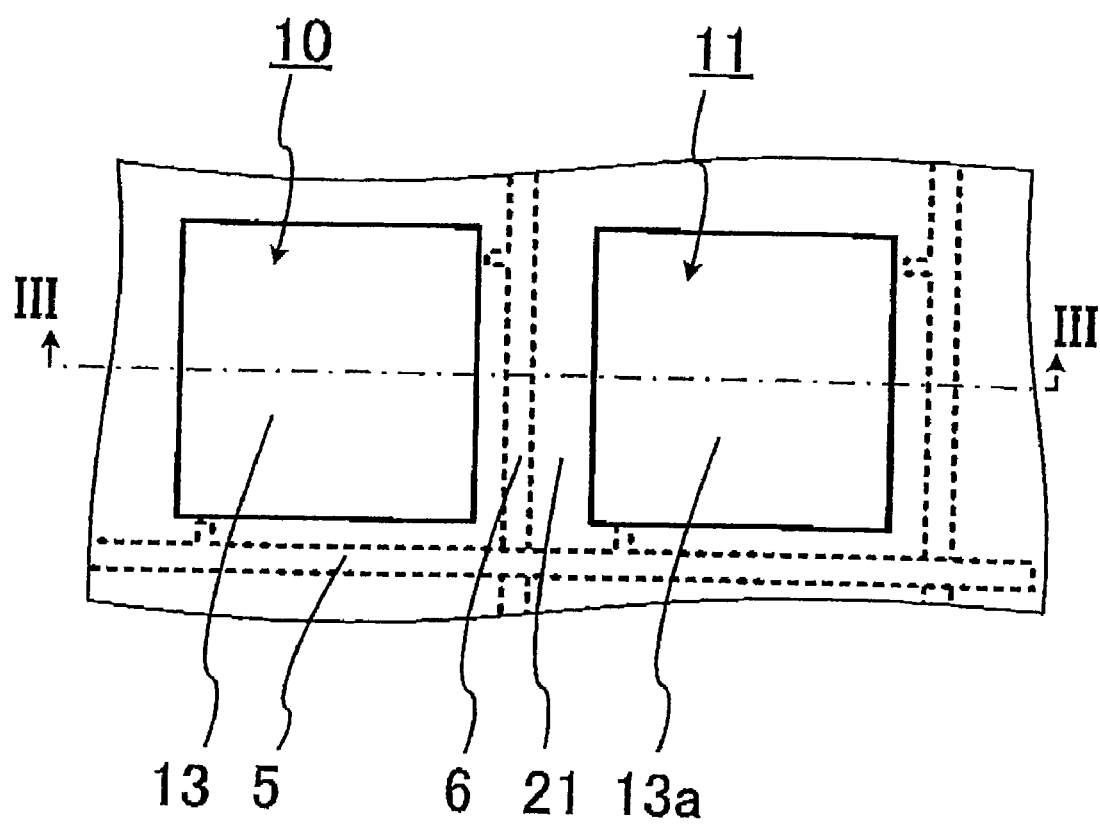
FIG. 2 is a plan view illustrating a pixel portion of the thermal-type infrared image sensing device according to Embodiment 1 of the present invention.
Figure 3:
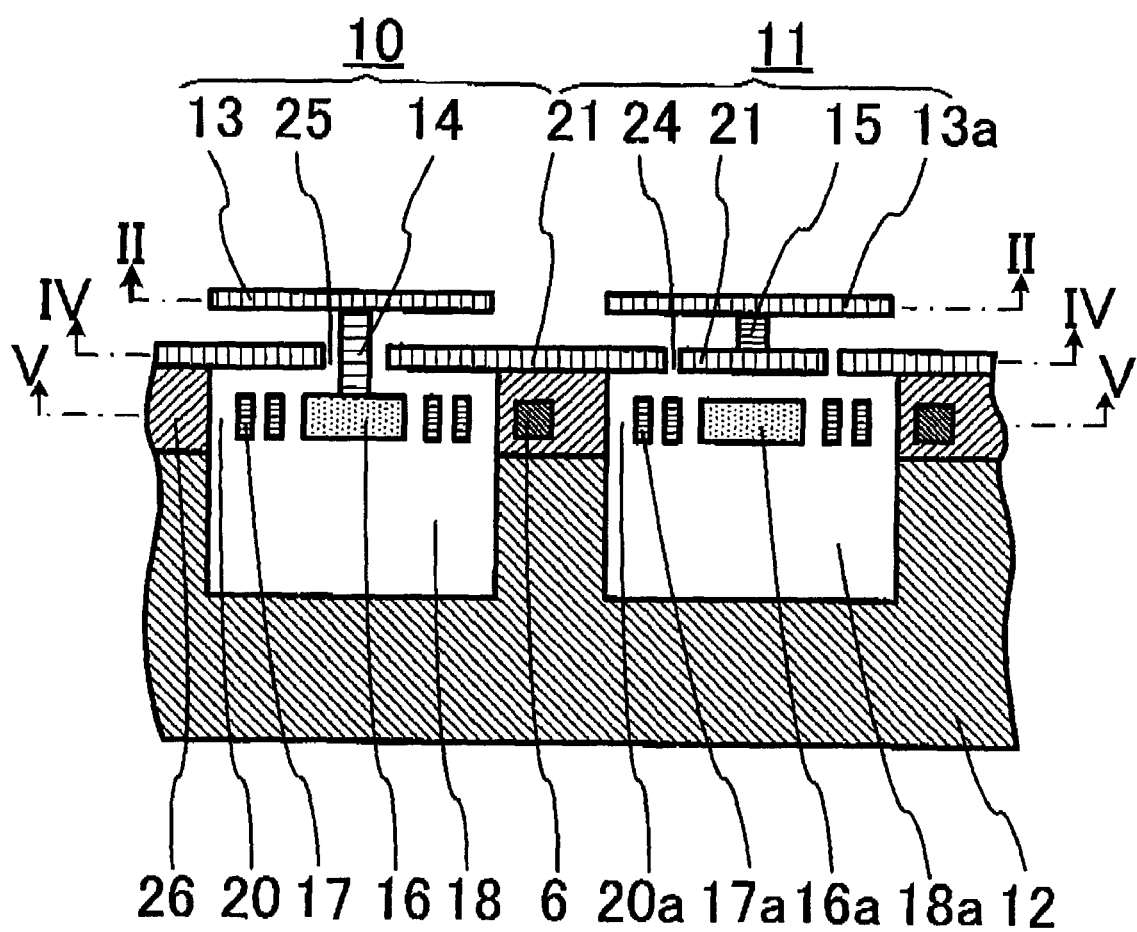
FIG. 3 is a cross-sectional view illustrating the pixel portion of the thermal-type infrared image sensing device according to Embodiment 1 of the present invention.
Figure 4:
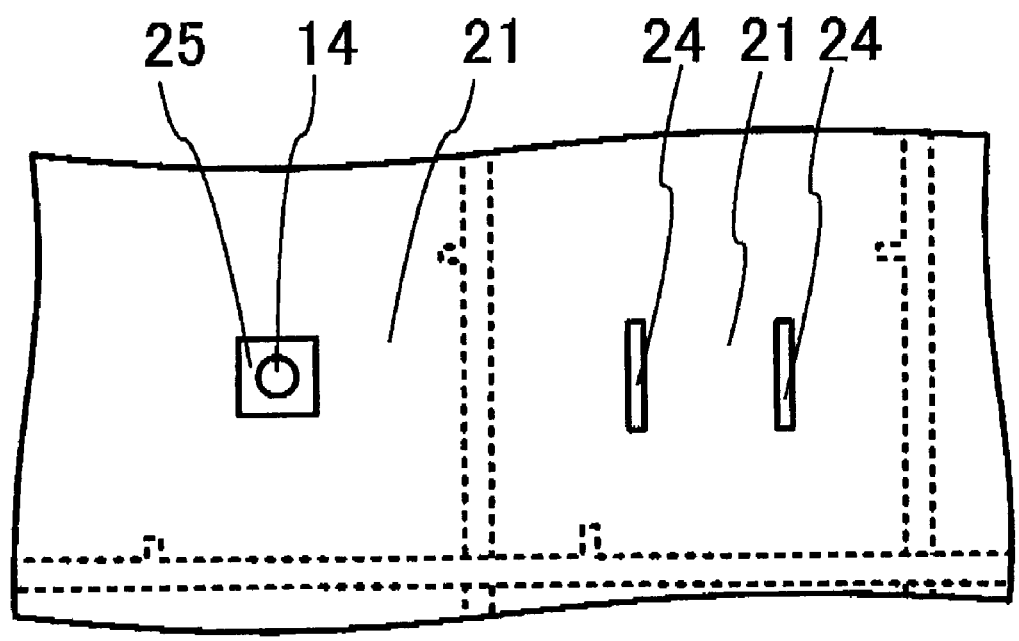
FIG. 4 is a plan view illustrating the pixel portion of the thermal-type infrared image sensing device according to Embodiment 1 of the present invention.
Figure 5:
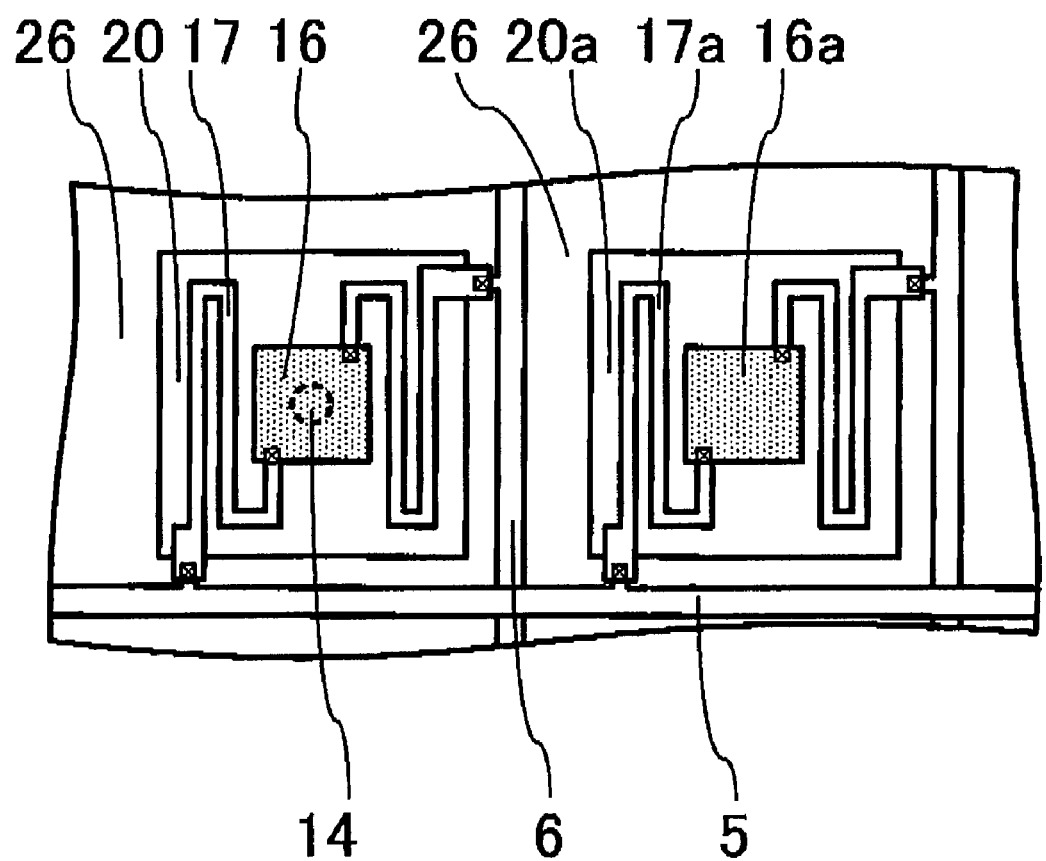
FIG. 5 is a plan view illustrating the pixel portion of the thermal-type infrared image sensing device according to Embodiment 1 of the present invention.

FIG. 1 is a perspective view illustrating a schematic configuration of an infrared image sensing device according to Embodiment 1 of the present invention. FIG. 2 is an enlarged plan view of a portion indicated by symbol II in FIG. 1, in which a pixel element 10 and a reference-pixel element 11 adjacent to each other are extracted and illustrated. FIG. 3 is a schematic cross-sectional view of a cross section indicated by symbol III-III in FIG. 2, viewed in the arrow direction, of the pixel element 10 and the reference-pixel element 11 adjacent to each other. FIG. 4 is a plan view of a cross section indicated by symbol IV-IV in FIG. 3, viewed in the arrow direction, and is an enlarged planarly-viewed schematic view of the portion indicated by symbol II in FIG. 1. Similarly, FIG. 5 is a plan view of a cross section indicated by symbol V-V in FIG. 3, viewed in the arrow direction, and is an enlarged planarly-viewed schematic view of the portion indicated by symbol II in FIG. 1.

First, the entire configuration of the infrared image sensing device is explained.

In FIG. 1, the infrared image sensing device is configured with pixel elements 10, reference-pixel elements 11, a horizontal scanning circuit 2, a vertical scanning circuit 3, an output amplifier 4, etc. The pixel elements 10 are arranged in a two-dimensional array in a region, on a substrate, on which an image is focused by an optical system (not illustrated) (hereinafter referred to as an imaging region). In addition, the reference-pixel elements 11 are arranged along the peripheral rows, outside the arranged pixel elements 10. Each of output signals from the pixel elements 10 and the reference-pixel elements 11 is read out by the horizontal scanning circuit 2 and the vertical scanning circuit 3 through vertical selection lines 5 and signal lines 6, and outputted to the exterior of the device through the output amplifier 4.

Here, the pixel element defined here means what operates to generate an imaging signal of the infrared image sensing device and is a minimum repeating unit of the infrared image sensing device, in which an infrared-light absorber, a detector, etc. are arranged. Similarly, the reference-pixel element is also a minimum repeating unit.

As described above, the reference-pixel elements 11 are arranged to form a pixel group so as to surround a peripheral region (that is, an imaging region), in the proximity thereof, of the pixel elements 10 arranged in a two-dimensional array. Here, it is most effective that the reference-pixel elements 11 are arranged so as to surround the periphery of the imaging region; however, even though the reference-pixel elements 11 are arranged only along any one side of the periphery of the imaging region, a specific effect according to the present invention can be obtained as explained later.

Next, the structure of the infrared image sensing device is explained in accordance with FIG. 3.

The infrared image sensing device is configured with detectors 16 and 16a using SOI (silicon on insulator) diodes each formed on a buried oxide layer (not illustrated in figures; hereinafter, referred to as a BOX layer) in an SOI substrate. The SOI diode functions to convert heat into an electrical signal. An Si substrate 12 has spaces 18 and 18a formed by a partial etching process, in which the detectors 16 and 16a are supported by respective supports 17 and 17a apart from the Si substrate 12. Accordingly, the device is structured so that thermal conductivity from the detectors 16 and 16a to the Si substrate 12 is reduced. Therefore, because in the pixel element 10 the temperature of a portion, to be detected, mounted on the heat-insulated structure is increased by infrared light incident on the device, by detecting the increase of the temperature using a thermoelectric conversion device, the amount of the temperature increase can be outputted as an electrical signal. Here, this structure can be produced using a micro-machining technology. For example, the supports 17 and 17a are configured of a wiring component made of titanium nitride and dielectric layers made of silicon oxide being laminated. Here, the dielectric layer is mainly used for increasing the rigidity of the supports 17 and 17a.

The pixel element 10 is further explained in accordance with FIG. 3. As described above, the pixel element 10 is configured to include an infrared-light absorber 13, the detector 16, and the supports 17, and the infrared-light absorber 13 is connected to the detector 16 apart therefrom through a pixel-element connector 14. Here, the infrared-light absorber 13 (as well as an infrared-light absorber 13a) is, for example, made of a thin metal film made of titanium nitride, whose sheet resistance is approximately 350 ohm, and sandwiched with dielectric films made of silicon oxide. Moreover, due to an optical resonant structure constituted by the infrared-light absorber 13 or 13a and an infrared-light reflector 21 described later, the device is structured so that infrared light incident on the infrared-light absorbers 13 and 13a can be effectively absorbed by them.

Similarly referring to FIG. 3, the reference-pixel element 11 is explained. The reference-pixel element 11 is configured to include the infrared-light absorber 13a, the detector 16a, and the supports 17a, and the infrared-light absorber 13a is connected to the infrared-light reflector 21 apart therefrom through a reference-pixel-element connector 15. Here, the detector 16a is supported only by the supports 17a, so that the detector 16a is structured to be thermally insulated from the Si substrate; thus, with respect to this point, the supporting structure is similar to that in the pixel element 10. In the pixel element 10, the infrared-light absorber 13 is thermally connected to the detector 16, while, in the reference-pixel element 11, the infrared-light absorber 13a is not connected to the detector 16a.

The difference between the pixel element 10 and the reference-pixel element 11 is explained by referring to FIG. 2, FIG. 4, and FIG. 5. FIG. 2 is the plan view of the infrared image sensing device illustrated in FIG. 1, and is the enlarged view of the portion where the pixel element 10 and the reference-pixel element 11 are arranged adjacent to each other. The infrared-light absorber 13 and the infrared-light absorber 13a that are identical to each other are provided on the respective surfaces of the elements; therefore, no difference can be found between the pixel element 10 and the reference-pixel element 11. Here, a vertical selection line 5 and a signal line 6 are represented by broken lines in FIG. 2; however, they are not actually provided on the surface of the device, but laid on a lower layer thereof, which are viewed therethrough.

Next, a layer under the infrared-light absorbers 13 and 13a represented in FIG. 2 is illustrated in FIG. 4. The infrared-light reflector 21 is provided, as a structure for shielding incident infrared light, all over its layer under the infrared-light absorbers 13 and 13a, in which holes (slits 24 and an opening 25) reaching a lower layer are formed in some portions. The opening 25 whose size is large enough to pass the pixel-element connector 14 is formed in a region of the pixel element 10. While, the slits 24 as narrow openings are formed in a region of the reference-pixel element 11. The infrared-light reflector 21 is configured, for example, by providing an infrared-light reflective film made of chromium in a dielectric film made of silicon oxide, whose infrared-light reflectance is approximately 90 percent or higher. The infrared-light reflector 21 is formed so as not to contact with the detectors 16 and 16a, and is fixed to the Si substrate through an Si oxide film 26. Although the infrared-light reflector 21 as a component having a multiple-reflection structure contributes to absorb incident light, it is connected to neither each of the detectors 16 and 16a nor each of the infrared-light absorbers 13 and 13a. Here, the slits 24 and the opening 25 described above are opened for forming the spaces 18 and 18a by etching the Si substrate via these holes.

FIG. 5 is explained in which a layer lying under the infrared-light reflector 21 is represented. The detectors 16 and 16a are supported only by the respective supports 17 and 17a, and are structured to be thermally insulated from the Si substrate. The supports 17 and 17a each have a meanderingly elongated and highly heat-insulating shape. The supporting structure of the pixel element 10 and that of the reference-pixel element 11 are similar to each other; however, in the pixel element 10 the pixel-element connector is connected to the detector 16, while in the reference-pixel element 11 nothing is connected to the detector 16a from above. Here, a layer of the infrared-light reflector 21 is provided above this layer.

According to the above described pixel configuration, incident infrared light is absorbed by the infrared-light absorber 13 in the pixel element 10, and converted to heat therein. Then, because the infrared-light absorber 13 is connected to the detector 16 through the pixel-element connector 14, the heat is conducted to the detector 16, and converted to an electrical signal by a diode provided therein.

On the other hand, even though incident infrared light is absorbed by the infrared-light absorber 13a in the reference-pixel element 11, and converted to heat therein, because the infrared-light absorber 13a is connected to the infrared-light reflector 21 through the reference-pixel-element connector 15, but not connected to the detector 16a, the detector 16a generates no electrical signal based on the infrared incident light.

According to the above described pixel configuration, the support structures of the pixel element 10 and the reference-pixel element 11 are the same. That is, both of their detectors 16 and 16a are supported only by the respective supports 17 and 17a, and are structured so as to be thermally insulated from the Si substrate. Therefore, the heat transport condition from the detectors to the image sensing device main body is not significantly different between the pixel element 10 and the reference-pixel element 11. Accordingly, due to self-heat generation accompanying an operation of reading pixel signals, significant difference of output levels from the reference-pixel element and the pixel element does not occur; thereby, the output level from the reference-pixel element is to be an ideal reference voltage.

Because the pixel element 10 and the reference-pixel element 11 include the respective infrared-light absorbers 13 and 13a that are identical to each other, incident infrared light is blocked by the infrared-light absorbers 13a and the infrared-light reflector 21 provided thereunder, and thus the incident infrared light is not incident on the detectors 16a; therefore, in the reference-pixel element 11 any output signal due to incident infrared light from the exterior is never generated either. Therefore, a disadvantage does not also occur in that an unnecessary output signal is overlapped on the reference voltage.

Moreover, because the pixel element 10 and the reference-pixel element 11 having the infrared-light absorbers 13 and 13a, respectively, whose structures are identical to each other are arranged adjacent to each other, the shape of the pixel element 10 positioned around the center of the image sensing region and that of the pixel element 10 adjacent to the reference-pixel element 11 are to be approximately identical to each other. Therefore, the characteristics of signals outputted from the pixel element 10 adjacent to the reference-pixel element 11 are not to differ from those from the pixel element 10 in a center-side row.

Hereinafter, this reason is supplementarily explained. Generally, a problem occurs in that, in the pattern of pixel elements positioned at the most peripheral portion of the elements consecutively arranged in an array manner, a little bit of size misalignment is generated depending on the production process, compared to those positioned thereinside. For example, when etching is performed, due to a phenomenon that the etching rate increases at the peripheral portion, the pattern size thereof decreases a little. Accordingly, when the pixel element 10 and the reference-pixel element 11 are arranged adjacent to each other, if the infrared-light absorber 13a is not provided on the reference-pixel element 11, the light receiving area of the pixel elements positioned at the most peripheral row of the pixel-element rows is decreased; therefore, the output-signal characteristics are slightly deteriorated. However, as described above, because, due to the infrared-light absorber 13a being provided also on the reference-pixel element 11, discontinuity of the arranged patterns can be removed, such a problem can be overcome.

As a result, because the pixel element 10 positioned around the center of the image sensing region and that adjacent to the reference-pixel element 11 are to have the infrared-light absorbers 13 whose shapes are approximately identical to each other, their aperture ratios for incident infrared light become approximately equivalent to each other. Therefore, the output-signal characteristics can be uniformed for the entire image sensing region.

As described above, according to this embodiment, the heat-transport characteristics from the detectors 16 and 16a to the Si substrate 12, which are heat-insulating characteristics, are equivalent to each other between the pixel element 10 and the reference-pixel element 11. Because the pixel element 10 and the reference-pixel element 11 have the respective infrared-light absorbers 13 and 13a that are identical to each other, the reference voltage never fluctuates depending on incident infrared light from the exterior. Therefore, even in a case in which the device temperature is drastically varied, the device output level can be stabilized by a simple signal-processing circuit.

Moreover, because a light-shielding member placed above the device is not separately provided, a complicated procedure for increasing the size of the device and for production is not required.

Next, a method of producing the infrared image sensing device is explained. First, through general-purpose producing steps regularly used for producing semiconductor devices, signal-processing circuits such as the horizontal scanning circuit 2, the vertical scanning circuit 3, the output amplifier 4, and the detectors 16 and 16a, and the supports 17 and 17a, etc. are produced. Until these steps have been completed, the pattern producing modes and procedures for the pixel element 10 and the reference-pixel element 11 are not especially different from each other. The completion state of the device up to the steps described above is as illustrated in FIG. 5, when the pixel-element portion is enlarged and viewed from the top of the substrate.

As the next step, a step of creating the structures of the upper portions of the pixel element 10 and the reference-pixel element 11 that are two-dimensionally arranged is explained.

A first sacrifice layer made of organic material is formed on the signal-processing circuit, etc. described above. Patterning is performed in such a way that the first sacrifice layer is not formed at least on a portion of either or both of the vertical selection lines 5 and the signal lines 6 arranged around the supports 17 and 17a. Thereby, regarding the portion where the sacrifice layer is not provided, the infrared-light reflector 21 that is to be stacked next is bonded to the face of the substrate, and, even though the sacrifice layer is removed in a later step, the infrared-light reflector 21 can be resultantly supported by the substrate. The patterning of the sacrifice layer can also be performed by a lithography process using photo-resist as the first sacrifice layer, and also performed by a method of exposing the Si oxide film 26 formed on the signal lines 6, using an etching processing method or a polishing processing method after the photo-resist layer is formed on the entire face of the device. Then, the first sacrifice layer is cured.

Next, the infrared-light reflector 21 is formed. As materials for forming the infrared-light reflector 21, a material whose reflectance of infrared light is relatively high such as gold, platinum, aluminum, titanium, and chromium, and a dielectric film made of silicon oxide are used. The infrared-light reflector 21 is a laminate formed by sequentially depositing and laminating these materials on the surface of the Si substrate 12. For example, when aluminum is used for the infrared-light reflector 21 (that is, as the laminate), the suitable thickness is 50 nm; therefore, the thickness of each layer to be deposited is controlled so that the laminate thickness is 50 nm. In this lamination step, with respect to the pixel element 10, the opening 25 to be a hole through which the connector 14 is passed later is formed. While, with respect to the reference-pixel element 11, although the slits 24 for forming the space 18 are created by the etching process, an opening corresponding to the opening 25 is not provided. The completion state up to the steps described above is as illustrated in FIG. 4, when the pixel-element portion is enlarged and viewed from the top of the substrate.

Then, the second sacrifice layer is formed on this surface. As the material for the second sacrifice layer, for example, organic material may be used. In the pixel element 10, a hole is opened for creating the connector 14 for connecting the infrared-light absorber 13 with the detector 16. In the reference-pixel element 11, a hole is opened for creating the connector 15 for connecting the infrared-light absorber 13a with the infrared-light reflector 21.

As the opening method, an etching process using a hard mask made of a dielectric substance or a metal film can be applied; however, more easily, using photo-resist as the second sacrifice layer, the holes may also be formed by a lithographic process. Here, in the forming method using the lithography, also when the first sacrifice layer is formed, regarding only the pixel element 10, an opening is provided at a position corresponding to the connector 14.

Next, this second sacrifice layer is cured, and then the infrared-light absorbers 13 and 13a are formed. The infrared-light absorbers 13 and 13a are formed, for example, by laminating a thin metal film made of titanium nitride whose sheet resistance is approximately 350 ohm, and a dielectric film made of silicon oxide. Here, because the dielectric film, etc. adheres to the side walls of the holes created in the sacrifice layer, the connectors 14 and 15 are created at one time. The dielectric film, etc. may be buried in the connectors 14 and 15 as needed. Next, the infrared-light absorbers 13 and 13a are processed into required shapes by a lithographic and a patterning process. The completion state up to the steps described above is as illustrated in FIG. 2, when the pixel-element portion is enlarged and viewed from the top of the substrate.

Finally, by removing the first sacrifice layer, the second sacrifice layer, and a part of the Si substrate 12, the procedure is completed. The cross-sectional state of the pixel-element portion after the completion of the procedure is illustrated in FIG. 3.

In the above described production method, materials to form the infrared-light reflector 21 are sequentially deposited and laminated on the detectors 16 and 16a and the supports 17 and 17a with the first sacrifice layer intervening therebetween, and the infrared-light reflector 21 is directly formed without the sacrifice layer intervening on the vertical selection lines 5 and the signal lines 6 where the spaces 18 are not formed just thereunder; therefore, a structure for shielding the pixel elements from light can be easily manufactured. Moreover, because the difference in production between the pixel element 10 and the reference-pixel element 11 is only based on the difference between the mask patterns used in the lithography, the procedure is very simple, and a highly-accurate patterning process can be realized. Therefore, a pixel structure can be easily realized in which the output level, as the reference voltage, of the reference-pixel element is close to that of the pixel element.

Embodiment 2

The configuration of the device has been explained in Embodiment 1 as described above, in which heat-insulating characteristics between the pixel element and the reference-pixel element are approximately equal to each other; hereinafter, a configuration of a device is explained in which heat capacities of the detectors 16 and 16a are also made to be approximately equal to each other.

Regarding the pixel elements 10 and the reference-pixel elements 11, in addition to the response characteristics for incident infrared light from the exterior, equivalent characteristics for temperature sensitivity are also required. That is, the respective heat-insulating characteristics and the respective heat capacities are required to be equal to each other. In Embodiment 1 described above, the heat-insulating characteristics of the pixel element and the reference-pixel element are approximately equal to each other. However, because the infrared-light absorber 13a of the reference-pixel element 11 is not connected to the detector 16a, when comparing it with the pixel element 10 considered to be integrated with the infrared-light absorber 13 and the detector 16, the heat capacity of the reference-pixel element 11 is less than that of the pixel element 10. Then, a configuration of a device is explained in which, by changing the configuration of the detector 16a of the reference-pixel element 11, the heat capacities of the pixel element 10 and the reference-pixel element 11 are equalized to each other.

Figure 6:
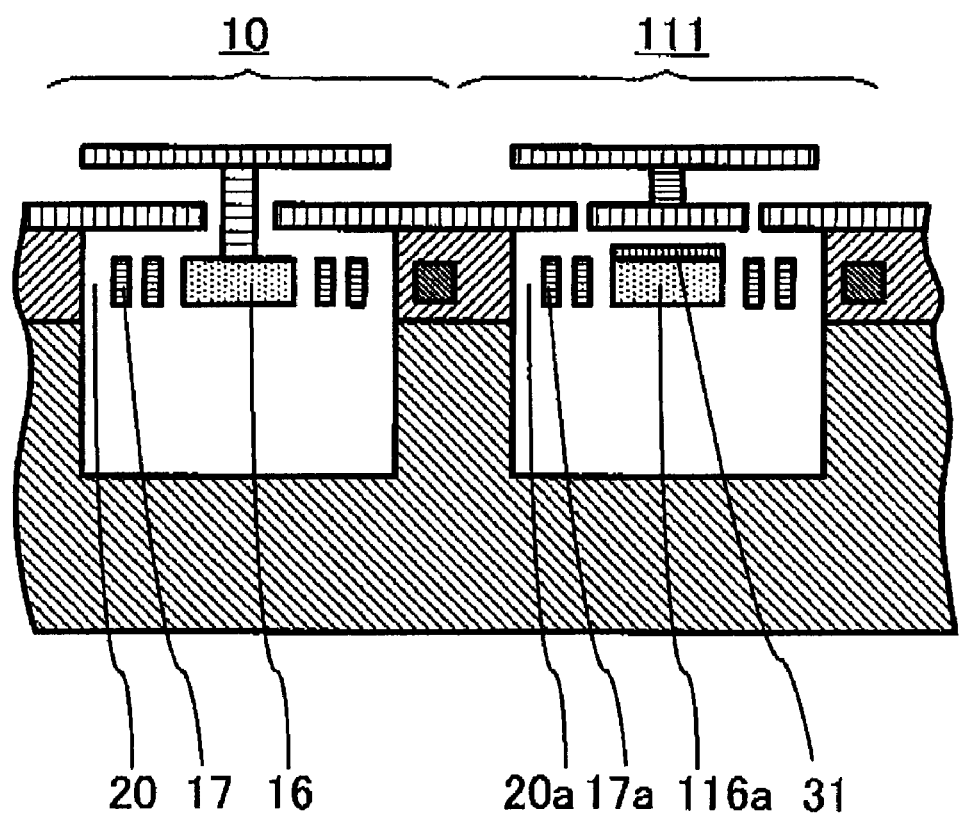
FIG. 6 is a cross-sectional view illustrating a pixel portion of a thermal-type infrared image sensing device according to Embodiment 2 of the present invention.

FIG. 6 is an enlarged cross-sectional view illustrating a pixel portion of the device according to this embodiment, and schematically illustrates a cross section of the pixel element 10 and a reference-pixel element 111 provided adjacent to each other. Here, configurations except for that of a detector 116a being different from that in Embodiment 1 are similar to those in Embodiment 1. Therefore, effects similar to those in Embodiment 1 can be obtained in addition to that caused by the specific configuration according to this embodiment explained hereinafter.

Referring to FIG. 6, a silicon-nitride film 31 as a heat-capacity controlling member is formed on the detector 116a of the reference-pixel element 111. The thickness of the silicon-nitride film 31 is set so that its heat capacity is equivalent to that of the infrared-light absorber 13a. Here, according to this configuration, the silicon-nitride film 31 can be formed with little damage to the supports 17a that have been microstructured by laminating dielectric layers made of silicon oxide.

According to the above described configuration, the heat capacities of the pixel element 10 and the reference-pixel element 111 can be made approximately equivalent to each other. Thus, because the thermal characteristics of the pixel element 10 and the preference-pixel element 111 become equal to each other, there appears to be no significant difference between the characteristics of the output signal from the pixel element 10 in a state of infrared-light being not incident from the exterior and those from the reference-pixel element 111. Therefore, by directly feeding back signals outputted from the reference-pixel portion to the processing for signals outputted from the pixel portion, signal processing can also be carried out. Especially, when the energizing time to the detector 16 is shorter than the thermal time constant of the pixel element, the difference in the temperature-increase rates caused by the heat capacities of the pixel elements becomes significant; however, according to the pixel configuration of this embodiment, because there appears to be no significant difference between the characteristics of the output signal from the pixel element 10 and those from the reference-pixel element 11, even in an infrared image sensing device in which the frame rate is relatively high, the output level from the device can be controlled to be within a certain range without controlling the temperature.

Embodiment 3

Although, in Embodiment 1 described above, the example has been represented in which both of heat-insulating characteristics and heat-absorbing characteristics of the pixel element 10 and the reference-pixel element 11 are respectively identical to each other, in the reference-pixel element 11 the heat-absorptive characteristics may not be necessary. However, because the reference-pixel element 11 is provided with the detector 16a, any structure for shielding the detector 16a from incident infrared light is needed to be provided thereupon. Hereinafter, structures with respect to such configurations are explained in this embodiment.

Figure 7:
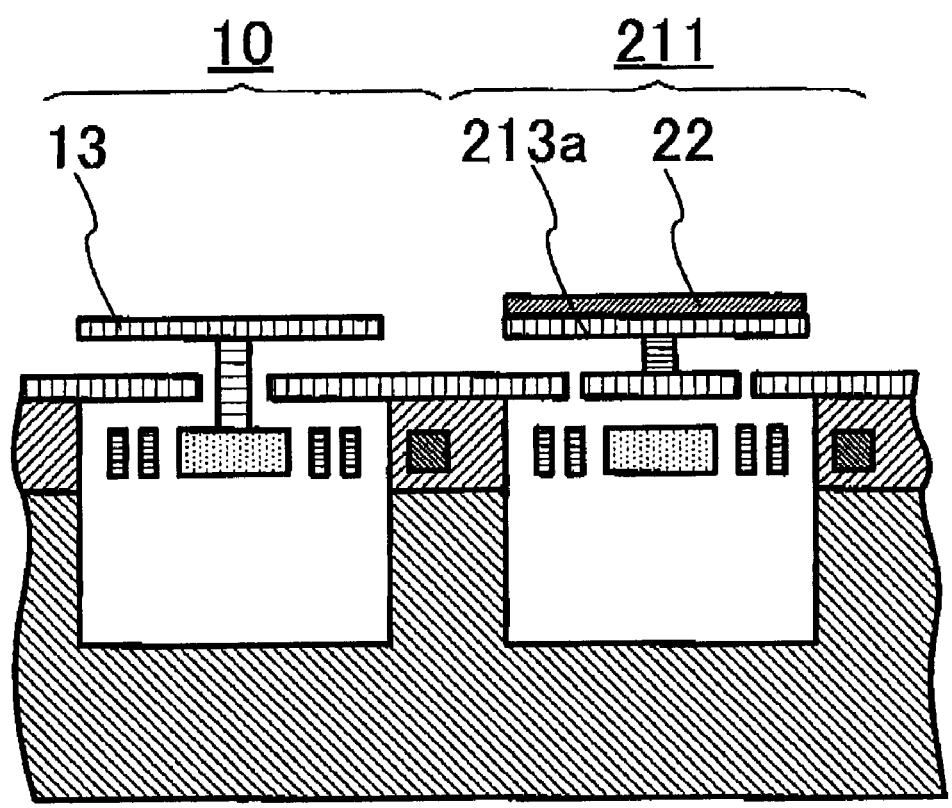
FIG. 7 is a cross-sectional view illustrating a pixel portion of a thermal-type infrared image sensing device according to Embodiment 3 of the present invention.

FIG. 7 is an enlarged cross-sectional view illustrating a pixel portion according to this embodiment, which is a schematic view illustrating a cross section of the pixel element 10 and a reference-pixel element 211 provided adjacent to each other. Here, configurations except for that of the infrared-light absorber 213a being different from that in Embodiment 1 are similar to those in Embodiment 1. Therefore, effects similar to those in Embodiment 1 can be obtained in addition to that caused by the specific configuration according to this embodiment explained hereinafter.

As illustrated in FIG. 7, if an infrared-light shield 22 is formed on the infrared-light absorber 213a of the reference-pixel element 211, the reference-pixel element 211 can be more completely shielded from infrared light. As explained in Embodiment 1 described above, because the slits 24 are provided in the infrared-light reflector 21, incident infrared light may reach the detector 16a through these holes. Accordingly, by forming the infrared-light reflector 21 on the infrared-light absorber 213a, the quantity of light penetrating thereinto is reduced. As the shield, for example, a film made of aluminum can be used.

Figure 8:
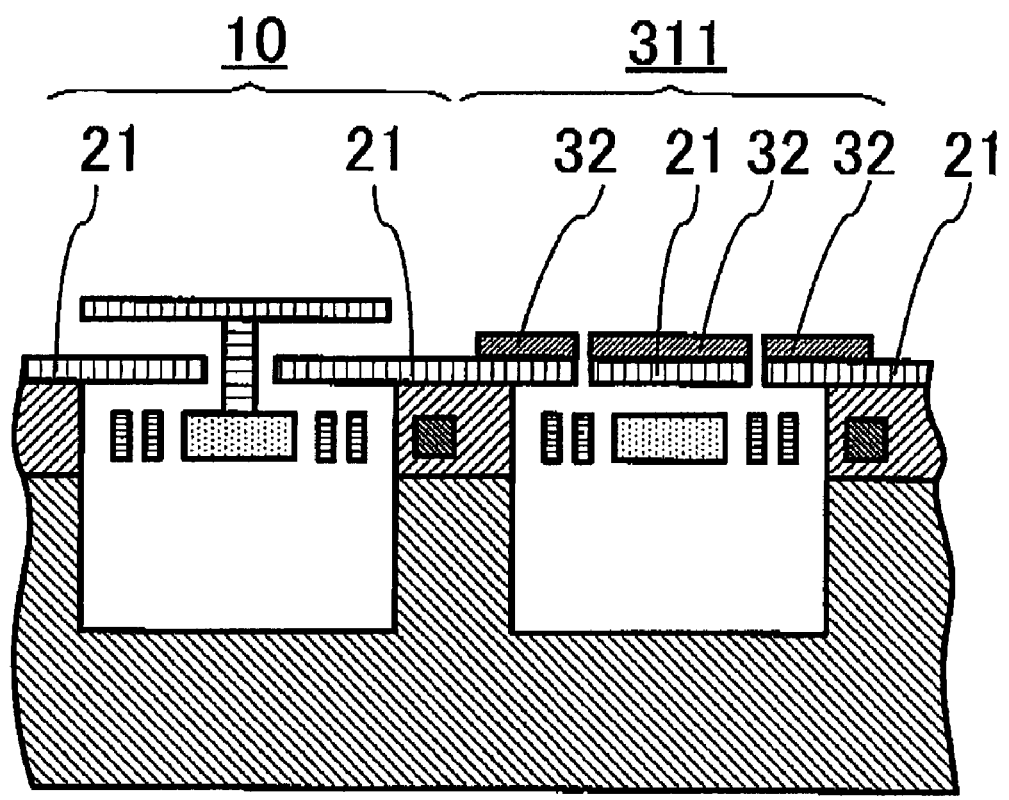
FIG. 8 is a cross-sectional view illustrating a pixel portion of another thermal-type infrared image sensing device according to Embodiment 3 of the present invention.

Moreover, by a configuration illustrated in FIG. 8, a reference-pixel element 311 can be shielded similarly to that described above. Referring to FIG. 8, although the infrared-light absorber 13a is not provided on the reference-pixel element 311, an infrared-light shield 32 is arranged on the infrared-light reflector 21.

In the above described embodiment, because, by using the infrared-light shield 32, the reference-pixel element 311 can be surely shielded, even if the device temperature drastically varies, output from the device can be stabilized by a simple signal processing circuit.

Here, in the example represented in FIG. 8, by using the infrared-light shield 32, the incident infrared light has been shielded; however, in a case of the infrared-light reflector 21 having a reflectivity of close to 100 percent, a configuration can also be applied in which the infrared-light shield 32 is omitted.

What is claimed is:

1. A thermal-type infrared image sensing device comprising:
    pixel elements, being two-dimensionally arranged on a semiconductor substrate, each pixel element having:
        a first detector for detecting temperature,
        a first infrared-light absorber, supported above the first detector apart therefrom through a first connector thereon, for absorbing incident infrared light and converting the light into heat, and
        a first support for supporting the first detector apart from the semiconductor substrate; and
    reference-pixel elements, arranged adjacent to and along a row of the pixel elements two-dimensionally arranged, each for generating a reference signal to be a reference for a signal generated by each of the pixel elements, the reference-pixel elements each having:
        a second detector identical to the first detector,
        a second support identical to the first support and for supporting the second detector to be positioned apart from the semiconductor substrate, and
        a light reflector for shielding the second detector from incident infrared light, the light reflector being a part of a layer deposited on the surface of the semiconductor substrate, and being supported above the second detector apart therefrom such that an empty space is provided between a top surface of the second detector and a bottom surface of the light reflector.

2. A thermal-type infrared image sensing device as recited in claim 1, wherein the second detector is provided with a heat-capacity controlling member for controlling the heat capacity of the second detector.

3. A thermal-type infrared image sensing device as recited in claim 1, wherein any one of gaps of the reference-pixel elements is equal to that of the two-dimensionally arranged pixel elements.

4. A thermal-type infrared image sensing device as recited in claim 1, wherein the reference-pixel elements each have a second infrared-light absorber whose shape is identical to the first infrared-light absorber provided for each of the pixel elements, and the second infrared-light absorber is connected to the light reflector through a second connector.

5. A thermal-type infrared image sensing device as recited in claim 4, wherein the reference-pixel elements each have a light shield, over the top of the second infrared-light absorber, for shielding the elements from incident infrared light.

6. A thermal-type infrared image sensing device comprising:
an image sensing region configured with pixel elements, being two-dimensionally arranged on a semiconductor substrate, each pixel element having:
a first detector for generating a signal according to temperature,
a first infrared-light absorber, supported above the first detector apart therefrom through a first connector thereon, for absorbing incident infrared light and converting the light into heat, and
a first support for supporting the first detector apart from the semiconductor substrate; and
a group of reference-pixel elements being arranged adjacent to the region configured with the pixel elements, and each of the reference-pixel elements having:
a second detector identical to the first detector,
a second support identical to the first support for supporting the second detector apart from the semiconductor substrate, and
a laminate, being a part of layers deposited on the surface of the semiconductor substrate and being supported above the second detector such that an empty space is provided between a top surface of the second detector and a bottom surface of the laminate, for shielding the second detector from incident infrared light.

7. A thermal-type infrared image sensing device as recited in claim 6, wherein the second detector is provided with a heat-capacity controlling member for controlling the heat capacity of the second detector.

8. A thermal-type infrared image sensing device as recited in claim 6, wherein any one of gaps of the reference-pixel elements is equal to that of the two-dimensionally arranged pixel elements.

9. A thermal-type infrared image sensing device as recited in claim 6, wherein the reference-pixel elements each have a second infrared-light absorber whose shape is identical to the first infrared-light absorber provided for each of the pixel elements, and the second infrared-light absorber is connected to the laminate through a second connector.

10. A thermal-type infrared image sensing device as recited in claim 9, wherein the reference-pixel elements each have a light shield, over the top of the second infrared-light absorber, for shielding the elements from incident infrared light.

11. A method of producing a thermal-type infrared image sensing device in which pixel elements, each having a first detector for detecting temperature, a first infrared-light absorber, supported above the first detector apart therefrom through a first connector thereon, for absorbing incident infrared light and converting the light into heat, and a first support for supporting the first detector apart from a silicon substrate are two-dimensionally arranged on the silicon substrate, and reference-pixel elements, each, having a second detector identical to the first detector, and a second support identical to the first support, for generating a reference signal to be a reference for a signal generated by each of the pixel elements are arranged outside, adjacent to and along a row of the pixel elements two-dimensionally arranged, the method comprising:
a step of forming on the silicon substrate the first and second detectors, the first and second supports, and a signal processing circuit;
a step of forming a first sacrifice layer on the first and second detectors and the first and second supports;
a step of forming a layer to be a light reflector for covering the first sacrifice layer and the silicon substrate;
a step of forming with respect to each of the pixel elements an opening, to be a hole through which the first connector is passed in a later step, in a region of the layer to be the light reflector provided above the first and second detectors;
a step of forming a second sacrifice layer on the light reflector;
a step of burying, with respect to each of the pixel elements, after removing portions of the first and second sacrifice layers provided on a region, where the first connector for connecting the first infrared-light absorber with the first detector is formed in a later step, above a part of the first detector, material to be the first connector in the removed region;
a step of burying, with respect to each of the reference-pixel elements, after removing a portion of the second sacrifice layer provided on a region, where a second connector for connecting a second infrared-light absorber with the light reflector is formed in a later step, above a part of the second detector, material to be the second connector in the removed region;
a step of forming a thin film to be the first and second infrared-light absorbers on the second sacrifice layer and the respective first and second connectors, and patterning the film with the first and second infrared-light absorbers so as to be separated for each of the pixel elements and the reference-pixel elements, respectively;
a step of etching the silicon substrate under the first and second detectors and the first and second supports, so as to form spaces in the silicon substrate; and
a step of etching to remove the first and second sacrifice layers.

* * * * *